United States Patent
Takamoto et al.

(10) Patent No.: US 10,141,217 B2
(45) Date of Patent: Nov. 27, 2018

(54) DICING-TAPE INTEGRATED FILM FOR BACKSIDE OF SEMICONDUCTOR AND METHOD OF MANUFACTURING SEMICONDUCTOR DEVICE

(71) Applicant: NITTO DENKO CORPORATION, Ibaraki-shi, Osaka (JP)

(72) Inventors: Naohide Takamoto, Ibaraki (JP); Hiroyuki Hanazono, Ibaraki (JP); Akihiro Fukui, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 188 days.

(21) Appl. No.: 14/710,696

(22) Filed: May 13, 2015

(65) Prior Publication Data

US 2015/0364357 A1   Dec. 17, 2015

(30) Foreign Application Priority Data

May 16, 2014   (JP) .................. 2014-102040

(51) Int. Cl.
*H01L 23/40* (2006.01)
*H01L 23/52* (2006.01)
(Continued)

(52) U.S. Cl.
CPC ........ *H01L 21/6836* (2013.01); *H01L 23/544* (2013.01); *H01L 24/83* (2013.01);
(Continued)

(58) Field of Classification Search
CPC ......... H01L 2224/8385; H01L 21/6836; H01L 2924/0665; H01L 23/49514
(Continued)

(56) References Cited

U.S. PATENT DOCUMENTS

| 2010/0193968 A1 | 8/2010 | Takamoto et al. |
| 2011/0052853 A1 | 3/2011 | Sugo et al. |
| 2012/0028418 A1* | 2/2012 | Asai .................. C09J 7/02 438/114 |

FOREIGN PATENT DOCUMENTS

| JP | 2003-160771 A | 6/2003 |
| JP | 2011-71486 A | 4/2011 |

(Continued)

OTHER PUBLICATIONS

Japanese Notice of Allowance issued in corresponding Japanese Patent Application No. 2014-102040 dated Dec. 15, 2017.

*Primary Examiner* — S. V. Clark
(74) *Attorney, Agent, or Firm* — Sughrue Mion, PLLC (57) ABSTRACT

The present invention is to provide a dicing-tape integrated film for the backside of a semiconductor that is capable of suppressing the increase of the peel strength between the dicing tape and the film for the backside of a flip-chip semiconductor due to heating. The dicing-tape integrated film for the backside of a semiconductor has a dicing tape having a substrate and a pressure-sensitive adhesive layer formed on the substrate and a film for the backside of a flip-chip semiconductor formed on the pressure-sensitive adhesive layer of the dicing tape, in which the difference ($\gamma_2 - \gamma_1$) of the surface free energy $\gamma_2$ and the surface free energy $\gamma_1$ is 10 mJ/m$^2$ or more, where $\gamma_1$ represents the surface free energy of the pressure-sensitive adhesive layer and $\gamma_2$ represents the surface free energy of the film for the backside of a flip-chip semiconductor.

5 Claims, 1 Drawing Sheet

(51) Int. Cl.
  *H01L 29/40* (2006.01)
  *H01L 21/683* (2006.01)
  *H01L 23/00* (2006.01)
  *H01L 23/544* (2006.01)

(52) U.S. Cl.
  CPC .............. *H01L 24/84* (2013.01); *H01L 24/13* (2013.01); *H01L 24/16* (2013.01); *H01L 24/29* (2013.01); *H01L 24/32* (2013.01); *H01L 24/73* (2013.01); *H01L 24/92* (2013.01); *H01L 2221/68327* (2013.01); *H01L 2221/68377* (2013.01); *H01L 2223/54433* (2013.01); *H01L 2223/54486* (2013.01); *H01L 2224/131* (2013.01); *H01L 2224/13111* (2013.01); *H01L 2224/13144* (2013.01); *H01L 2224/13147* (2013.01); *H01L 2224/16227* (2013.01); *H01L 2224/2919* (2013.01); *H01L 2224/32225* (2013.01); *H01L 2224/73204* (2013.01); *H01L 2224/81007* (2013.01); *H01L 2224/81191* (2013.01); *H01L 2224/81815* (2013.01); *H01L 2224/81911* (2013.01); *H01L 2224/83007* (2013.01); *H01L 2224/83022* (2013.01); *H01L 2224/83104* (2013.01); *H01L 2224/83862* (2013.01); *H01L 2224/92125* (2013.01); *H01L 2924/15311* (2013.01); *Y10T 428/14* (2015.01)

(58) Field of Classification Search
  USPC .......................... 257/782, 783; 438/118, 119
  See application file for complete search history.

(56) References Cited

FOREIGN PATENT DOCUMENTS

| | | |
|---|---|---|
| JP | 2013-120839 A | 6/2013 |
| JP | 5456440 B2 | 3/2014 |

\* cited by examiner

DICING-TAPE INTEGRATED FILM FOR BACKSIDE OF SEMICONDUCTOR AND METHOD OF MANUFACTURING SEMICONDUCTOR DEVICE

BACKGROUND OF THE INVENTION

Field of the Invention

The present invention relates to a dicing-tape integrated film for the backside of a semiconductor and a method of manufacturing a semiconductor device.

Description of the Related Art

In recent years, thinning and downsizing of a semiconductor device and its packaging have been further required. Because of that, a flip-chip semiconductor device, in which a semiconductor element such as a semiconductor chip is flip-chip bonded on a substrate, has been widely used as a semiconductor device and its packaging. In the flip-chip bonding, a circuit surface of a semiconductor chip is fixed to an electrode forming surface of the substrate in a way that the circuit surface is facing to the electrode forming surface. In such semiconductor device, etc., the backside of the semiconductor chip may be protected by a film for the backside of a flip-chip semiconductor to prevent the semiconductor chip from damage, etc.

Conventionally, there has been a dicing-tape integrated film for the backside of a semiconductor in which a film for the backside of a flip-chip semiconductor is integrally pasted on a dicing tape (for example, refer to Patent Document 1).

PRIOR ART DOCUMENT

Patent Document

Patent Document 1: JP-B-5456440

SUMMARY OF THE INVENTION

However, in the dicing-tape integrated film for the backside of a semiconductor, there is a problem that the peel strength between the dicing tape and the film for the backside of a flip-chip semiconductor increases due to heating when a wafer is pasted onto the film for the backside of a flip-chip semiconductor, and pickup cannot be performed.

The present inventors have investigated a dicing-tape integrated film for the backside of a semiconductor to solve the above-described problem point. As a result, it was found that the increase of the peel strength between the dicing tape and the film for the backside of a flip-chip semiconductor due to heating can be suppressed by adopting the following configuration, and the present invention has been completed.

That is, the dicing-tape integrated film for the backside of a semiconductor according to the present invention has a dicing tape having a substrate and a pressure-sensitive adhesive layer formed on the substrate and a film for the backside of a flip-chip semiconductor formed on the pressure-sensitive adhesive layer of the dicing tape, and is characterized in that the difference ($\gamma 2 - \gamma 1$) of the surface free energy $\gamma 2$ and the surface free energy $\gamma 1$ is 10 mJ/m$^2$ or more, in which $\gamma 1$ represents the surface free energy that is calculated from contact angles of water and iodomethane measured using a contact angle gauge according to a geometric mean method on the pressure-sensitive adhesive layer, and $\gamma 2$ represents the surface free energy that is calculated from contact angles of water and iodomethane measured using a contact angle gauge according to a geometric mean method on the film for the backside of a flip-chip semiconductor after the pressure-sensitive adhesive layer and the film for the backside of a flip-chip semiconductor are peeled from each other at the interface.

In general, the surface free energy of the film surface becomes smaller as the component having higher polarity is contained in the film as a constituting material, and it becomes larger as the component having lower polarity is contained.

According to the above-described configuration, the difference ($\gamma 2 - \gamma 1$) is 10 mJ/m$^2$ or more. Therefore, the material constituting the film for the backside of a flip-chip semiconductor and the material constituting the pressure-sensitive adhesive layer differ in polarity. Because of that, the material constituting one of the layers hardly transfers into the other layer. Therefore, even when the film is heated, the increase of the peel strength between the dicing tape and the film for the backside of a flip-chip semiconductor can be suppressed.

In the above-described configuration, the surface free energy $\gamma 1$ is preferably 15 mJ/m$^2$ or less. When the surface free energy $\gamma 1$ is 15 mJ/m$^2$ or less, the difference ($\gamma 2 - \gamma 1$) can be made larger.

In the above-described configuration, the pressure-sensitive adhesive layer preferably has a silicone pressure-sensitive adhesive layer at the interface with the film for the backside of a flip-chip semiconductor. The difference ($\gamma 2 - \gamma 1$) can be easily made large when the pressure-sensitive adhesive layer has a silicone pressure-sensitive adhesive layer containing a silicone pressure-sensitive adhesive at the interface with the film for the backside of a flip-chip semiconductor.

In the above-described configuration, the pressure-sensitive adhesive layer preferably consists of a single layer of the silicone pressure-sensitive adhesive layer containing a silicone pressure-sensitive adhesive. The difference ($\gamma 2 - \gamma 1$) can be easily made large when the pressure-sensitive adhesive layer consists of a single layer of the silicone pressure-sensitive adhesive layer containing a silicone pressure-sensitive adhesive.

The method of manufacturing a semiconductor device according to the present invention is a method of manufacturing a semiconductor device using the dicing-tape integrated film for the backside of a semiconductor described above, and is characterized to have a step A of pasting a semiconductor wafer on a film for the backside of a flip-chip semiconductor in the dicing-tape integrated film for the backside of a semiconductor, a step B of performing laser marking to the film for the backside of a flip-chip semiconductor from the dicing tape side after the step A, a step C of dicing the semiconductor wafer to form a semiconductor element, a step D of peeling the semiconductor element from the pressure-sensitive adhesive layer together with the film for the backside of a flip-chip semiconductor, and a step E of flip-chip bonding the semiconductor element on an adherend.

According to the above-described configuration, because the film for the backside of a flip-chip semiconductor is used, the increase of the peel strength between the dicing tape and the film for the backside of a flip-chip semiconductor is suppressed even when the dicing-tape integrated film for the backside of a semiconductor is heated in the step A, etc. for example. Therefore, occurrence of poor peeling in the step D is suppressed. As a result, the yield ratio of the flip-chip semiconductor device can be improved.

BRIEF DESCRIPTION OF THE DRAWINGS

FIGS. 2(a) to 2(e) are schematic cross-sectional views showing one example of the method of manufacturing a semiconductor device using the dicing-tape integrated film for the backside of a semiconductor according to one embodiment of the preset invention.

Specifically,
FIG. 2(b) is a view showing laser marking step.
FIG. 2(c) is a view showing dicing step.
FIG. 2(d) is a view showing pickup step.
FIG. 2(e) is a view showing flip-chip connecting step.

DETAILED DESCRIPTION OF THE PREFERRED EMBODIMENTS (Dicing-Tape Integrated Film for the Backside of a Semiconductor)

Figure 1:
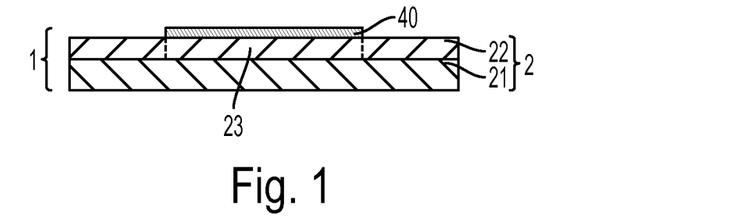
FIG. 1 is a schematic cross-sectional view showing one example of the dicing-tape integrated film for the backside of a semiconductor according to one embodiment of the present invention.

The dicing-tape integrated film for the backside for a semiconductor according to one embodiment of the present invention is explained below while referring to the drawings. FIG. 1 is a schematic cross-sectional view showing one example of the dicing-tape integrated film for the backside of a semiconductor according to one embodiment of the present invention. As shown in FIG. 1, a dicing-tape integrated film 1 for the backside of a semiconductor has a configuration having a dicing tape 2 in which a pressure-sensitive adhesive layer 22 is provided on a substrate 21 and a film 40 for the backside of a flip-chip semiconductor (referred to as "a film 40 for the backside of a semiconductor, below). As shown in FIG. 1, the dicing-tape integrated film for the backside of a semiconductor of the present invention may have a configuration in which the film 40 for the backside of a flip-chip semiconductor is formed only on a portion 23 corresponding to a pasting portion of a semiconductor wafer on the pressure-sensitive adhesive layer 22 of the dicing tape 2. However, it may have a configuration in which the film for the backside of a semiconductor is formed on the entire surface of the pressure-sensitive adhesive layer or it may have a configuration in which the film for the backside of a semiconductor is formed on a portion larger than the portion corresponding to the pasting portion of a semiconductor wafer and smaller than the entire surface of the pressure-sensitive adhesive layer. Further, the surface of the film for the backside of a semiconductor (the surface that is pasted to the backside of a wafer) may be protected by a separator, etc. until it is pasted to the backside of a wafer.

The difference ($\gamma 2-\gamma 1$) between the surface free energy $\gamma 1$ of a pressure-sensitive adhesive layer 22 and the surface free energy $\gamma 2$ of a film 40 for the backside of a semiconductor that are measured after the pressure-sensitive adhesive layer 22 and the film 40 for the backside of a semiconductor are peeled from each other at the interface is preferably 10 mJ/m$^2$ or more, more preferably 15 mJ/m$^2$ or more, and further preferably 20 mJ/m$^2$ or more.

In general, the surface free energy of the film surface becomes larger as the component having higher polarity is contained in the film as a constituting material, and it becomes smaller as the component having lower polarity is contained therein.

Because the difference ($\gamma 2-\gamma 1$) is 10 mJ/m$^2$ or more, the material constituting the film 40 for the backside of a semiconductor and the material constituting the pressure-sensitive adhesive layer 22 are used which differ in polarity. Because of that, the material constituting one of the layers hardly transfers into the other layer. Therefore, even when the film is heated, the increase of the peel strength between a dicing tape 2 (the pressure-sensitive adhesive layer 22) and the film 40 for the backside of a semiconductor can be suppressed.

The difference ($\gamma 2-\gamma 1$) can be controlled by appropriately selecting the material constituting the pressure-sensitive adhesive layer 22 and the materials constituting the film 40 for the backside of a semiconductor.

The surface free energy is each surface free energy of the pressure-sensitive adhesive layer 22 and the film 40 for the backside of a semiconductor when a dicing-tape integrated film 1 for the backside of a semiconductor is manufactured. For example, when the pressure-sensitive adhesive layer 22 contains a radiation curing type pressure-sensitive adhesive (or an energy beam curing type pressure-sensitive adhesive), it is a surface free energy before radiation (or before energy beam irradiation). Further, the surface free energy $\gamma 2$ of the film 40 for the backside of a semiconductor is a surface free energy before thermal curing.

The surface free energy $\gamma 1$ is preferably 15 mJ/m$^2$ or less, more preferably in a range of 15 mJ/m$^2$ to 5 mJ/m$^2$, and further preferably in a range of 13 mJ/m$^2$ to 7 mJ/m$^2$ as long as a relationship of $\gamma 2 > \gamma 1$ is satisfied. When the surface free energy $\gamma 1$ is 13 mJ/m$^2$ or less, the difference ($\gamma 2 - \gamma 1$) can be made larger.

The surface free energy $\gamma 2$ is preferably 30 mJ/m$^2$ or more, more preferably in a range of 50 mJ/m$^2$ to 30 mJ/m$^2$, and further preferably in a range of 40 mJ/m$^2$ to 32 mJ/m$^2$ as long as a relationship of $\gamma 2 > \gamma 1$ is satisfied. When the surface free energy $\gamma 2$ is 32 mJ/m$^2$ or more, the difference ($\gamma 2 - \gamma 1$) can be made larger.

The peel strength when the film 40 for the backside of a semiconductor is peeled from the pressure-sensitive adhesive layer 22 of the dicing-tape integrated film 1 for the backside of a semiconductor after it is heated at 130° C. for 1 hour under the condition of a T-type peeling test of measurement temperature of 23° C. and tensile speed of 300 mm/min is preferably 0.02 N/20 mm or more and 0.4 N/20 mm or less, more preferably 0.03 N/20 mm or more and 0.3 N/20 mm or less, and further preferably 0.04 N/20 mm or more and 0.2 N/20 mm or less. When the peel strength is 0.4 N/20 mm or more, chip fly may occur during dicing. When the peel strength is 0.2 N/20 mm or less, peeling can be performed preferably during pickup.

(Film for the Backside of a Flip-Chip Semiconductor)

cis preferably formed by containing a thermosetting resin and a thermoplastic resin.

Examples of the thermoplastic resin include a natural rubber, a butyl rubber, an isoprene rubber, a chloroprene rubber, an ethylene-vinyl acetate copolymer, an ethylene-acrylate copolymer, an ethylene-acrylic ester copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET (polyethylene terephthalate) and PBT (polybutylene terephthalate), a polyamideimide resin, and a fluororesin. The thermoplastic resins can be used alone or two types or more can be used together. Of these thermoplastic resins, acrylic resin is particularly preferable since the resin contains ionic impurities in only a small amount and has a high heat resistance so as to make it possible to ensure the reliability of the semiconductor element.

The acrylic resin is not especially limited, and examples thereof include a polymer having one type or two types or more of acrylates or methacrylates having a linear or branched alkyl group having 30 or less carbon atoms (preferably 4 to 18 carbon atoms, further preferably 6 to 10 carbon atoms, and especially preferably 8 or 9 carbon atoms) as a component. That is, the acrylic resin of the present invention has a broad meaning and also includes a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (a lauryl group), a tridecyl group, a tetradecyl group, a stearyl group, and an octadecyl group.

Other monomers that can form the above-described acrylic resin (monomers other than an alkylester of acrylic acid or methacrylic acid having an alkyl group having 30 or less carbon atoms) are not especially limited. Examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl) methylacrylate; monomers which contain a sulfonic acid group, such as styrenesulfonic acid, allylsulfonic acid, 2-(meth) acrylamide-2-methylpropanesulfonic acid, (meth)acrylamidepropane sulfonic acid, sulfopropyl (meth)acrylate, and (meth)acryloyloxynaphthalenesulfonic acid; and monomers which contain a phosphoric acid group, such as 2-hydroxyethylacryloyl phosphate. Among these, a carboxyl group-containing monomer is preferable from the viewpoint that the tensile storage modulus Ea of the die bond film can be set at a preferred value. (Meth)acrylate refers to an acrylate and/or a methacrylate, and every "(meth)" in the present invention has the same meaning.

Among these, an acrylic resin is preferable that is formed from a material containing acrylonitrile, acryloyl morpholine, etc. as monomer components from a viewpoint of improving the heat resistance of the film 40 for the backside of a semiconductor.

Examples of the thermosetting resin include an epoxy resin, a phenol resin, an amino resin, an unsaturated polyester resin, a polyurethane resin, a silicone resin, and a thermosetting polyimide resin. The thermosetting resins can be used alone or two types or more can be used together. An epoxy resin having a small amount of ionic impurities that erode the semiconductor element is especially suitable as the thermosetting resin. Further, a phenol resin can be suitably used as a curing agent for the epoxy resin.

The epoxy resin is not especially limited, and examples thereof include bifunctional epoxy resins and polyfunctional epoxy resins such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a bisphenyl type epoxy resin, a naphthalene type epoxy resin, a fluorene type epoxy resin, a phenol novolak type epoxy resin, an ortho-cresol novolak type epoxy resin, a trishydroxyphenylmethane type epoxy resin, and a tetraphenylolethane type epoxy resin, a hydantoin type epoxy resin, a trisglycidylisocyanurate type epoxy resin, and a glycidylamine type epoxy resin.

Among the above-described epoxy resins, a novolak type epoxy resin, a biphenyl type epoxy resin, a trishydroxyphenylmethane type epoxy resin, and a tetraphenylolethane type epoxy resin are especially preferable. These epoxy resins are highly reactive with a phenol resin as a curing agent and are excellent in heat resistance.

The phenol resin acts as a curing agent for the epoxy resin, and examples thereof include novolak type phenol resins such as a phenol novolak resin, a phenol aralkyl resin, a cresol novolak resin, a tert-butylphenol novolak resin, and a nonylphenol novolak resin, a resol type phenol resin, and polyoxystyrenes such as polyparaoxystyrene. The phenol resins can be used alone or two types or more can be used together. Among these phenol resins, a phenol novolak resin and a phenol aralkyl resin are especially preferable because connection reliability of the c can be improved.

The phenol resin is suitably compounded in the epoxy resin so that a hydroxyl group in the phenol resin to 1 equivalent of an epoxy group in the epoxy resin component becomes 0.5 to 2.0 equivalents. The ratio is more preferably 0.8 to 1.2 equivalents. When the compounding ratio goes out of this range, sufficient curing reaction does not proceed, and the characteristics of the epoxy resin cured substance easily deteriorate.

A thermal curing accelerating catalyst for an epoxy resin and a phenol resin may be used in the present invention. The thermal curing accelerating catalyst is not especially limited, and the catalyst can be appropriately selected from known thermal curing accelerating catalysts. The thermal curing accelerating catalysts can be used alone or two types or more can be used together. Examples of the thermal curing accelerating catalyst include an amine curing accelerator, a phosphorus curing accelerator, an imidazole curing accelerator, a boron curing accelerator and a phosphorus-boron curing accelerator.

The film 40 for the backside of a semiconductor are suitably formed of a resin composition containing an epoxy resin and a phenol resin and a resin composition containing an epoxy resin, a phenol resin, and an acrylic resin. Because these resins have few ionic impurities and high heat resistance, reliability of the semiconductor element can be ensured.

It is important that the film 40 for the backside of a semiconductor has tackiness (adhesion) to the backside (the surface where a circuit is not formed) of a semiconductor wafer. The film 40 for the backside of a semiconductor can be formed of a resin composition containing an epoxy resin as a thermosetting resin, for example. A polyfunctional compound that reacts with a functional group of the end of the polymer molecular chain is preferably added as a crosslinking agent to crosslink the film 40 for the backside of a semiconductor to some extent in advance. With this operation, the adhesion characteristics under high temperature can be improved and the heat resistance can be improved.

The crosslinking agent is not especially limited, and a known crosslinking agent can be used. Specific examples thereof include an isocyanate crosslinking agent, an epoxy crosslinking agent, a melamine crosslinking agent, a peroxide crosslinking agent, a urea crosslinking agent, a metal alkoxide crosslinking agent, a metal chelate crosslinking agent, a metal salt crosslinking agent, a carbodiimide crosslinking agent, an oxazoline crosslinking agent, an aziridine crosslinking agent, and an amine crosslinking agent. An isocyanate crosslinking agent and an epoxy crosslinking agent are preferable. The crosslinking agents can be used alone or two type or more can be used together.

Examples of the isocyanate crosslinking agent include lower aliphatic polyisocyanates such as 1,2-ethylene diisocyanate, 1,4-butylene isocyanate, and 1,6-hexamethylene diisocyanate; alicyclicpolyisocyanates such as cyclopentylene diisocyanate, cyclohexylene diisocyanate, isophorone diisocyanate, hydrogenated tolylene diisocyanate, and hydrogenated xylene diisocyanate; and aromatic polyisocyanates such as 2,4-tolylene diisocyanate, 2,6-tolylene diisocyanate, 4,4'-diphenylmethane diisocyanate, and xylylene diisiocyanate. A trimethylolpropane/tolylene diisocyanate trimer adduct (tradename: Coronate L manufactured by Nippon Polyurethane Industry Co., Ltd.) and a trimethylolpropane/hexamethylene diisocyanate trimer adduct (tradename: Coronate HL manufactured by Nippon Polyurethane Industry Co., Ltd.) can also be used. Examples of the epoxy crosslinking agent include N,N,N',N'-tetraglycidyl-m-xylenediamine, diglycidylaniline, 1,3-bis(N,N-glycidylaminomethyl)cyclohexane, 1,6-hexanediol diglycidylether, neopentylglycol diglycidylether, ethyleneglycol diglycidylether, propyleneglycol diglycidylether, polyethyleneglycol diglycidylether, polypropyleneglycol diglycidylether, sorbitol polyglycidylether, glycerol polyglycidylether, pentaerythritol polyglycidylether, polyglyserol polyglycidylether, sorbitan polyglycidylether, trimethylolpropane polyglycidylether, diglycidyl adipate, diglycidyl o-phthalate, triglycidyl-tris(2-hydroxyethyl)isocyanurate, resorcin diglycidylether, bisphenol-s-diglycidyl ether, and an epoxy resin having two or more epoxy groups in the molecule.

The used amount of the crosslinking agent is not especially limited, and can be appropriately selected according to the level of crosslinking. Specifically, the used amount of the crosslinking agent is normally preferably 7 parts by weight or less (0.05 to 7 parts by weight, for example) to 100 parts by weight of a polymer component (especially, a polymer having a functional group at the end of the molecular chain) for example. When the used amount of the crosslinking agent is more than 7 parts by weight to 100 parts by weight of the polymer component, it is not preferable because the adhering strength decreases. From the viewpoint of improving cohesive strength, the used amount of the crosslinking agent is preferably 0.05 parts by weight or more to 100 parts by weight of the polymer component.

In the present invention, it is possible to perform a crosslinking treatment by irradiation with an electron beam, an ultraviolet ray, or the like in place of using the crosslinking agent or together with a crosslinking agent.

The film 40 for the backside of a semiconductor includes coloring agent. With this configuration, the films 40 for the backside of a semiconductor is colored and can exhibit an excellent marking property and an excellent appearance, and a semiconductor device can be obtained having an appearance with added value. Because the colored film for the backside of a semiconductor has an excellent marking property, various information such as character information and pattern information can be given to a semiconductor device or the surface where a circuit is not formed of the semiconductor device in which the semiconductor element is marked through the film for the backside of a semiconductor using various marking methods such as a printing method and a laser marking method. Especially, the information such as character information and pattern information that is given by marking can be recognized visually with excellent visibility by controlling the color. Because the film for the backside of a semiconductor is colored, the dicing tape and the film for the backside of a semiconductor can be easily distinguished, and workability can be improved. It is possible to color-code the semiconductor device by product, for example. When the film for the backside of a semiconductor is colored (when it is not colorless or transparent), the color is not especially limited. However, the color is preferably a dark color such as black, blue, or red, and black is especially preferable.

In this embodiment, the dark color means a dark color having $L^*$ that is defined in the $L^*a^*b^*$ color system of basically 60 or less (0 to 60), preferably 50 or less (0 to 50) and more preferably 40 or less (0 to 40).

The black color means a blackish color having $L^*$ that is defined in the $L^*a^*b^*$ color system of basically 35 or less (0 to 35), preferably 30 or less (0 to 30) and more preferably 25 or less (0 to 25). In the black color, each of $a^*$ and $b^*$ that is defined in the $L^*a^*b^*$ color system can be appropriately selected according to the value of $L^*$. For example, both of $a^*$ and $b^*$ are preferably −10 to 10, more preferably −5 to 5, and especially preferably −3 to 3 (above all, 0 or almost 0).

In this embodiment, $L^*$, $a^*$, and $b^*$ that are defined in the $L^*a^*b^*$ color system can be obtained by measurement using a colorimeter (tradename: CR-200 manufactured by Konica Minolta Holdings, Inc.). The $L^*a^*b^*$ color system is a color space that is endorsed by Commission Internationale de l'Eclairage (CIE) in 1976, and means a color space that is called a CIE1976 ($L^*a^*b^*$) color system. The $L^*a^*b^*$ color system is provided in JIS Z 8729 in the Japanese Industrial Standards.

The coloring agent corresponding to the objective color can be used in the film 40 for the backside of a semiconductor. Various dark color materials can be used as the coloring agent such as black color materials, blue color materials, and red color materials, and black color materials are especially preferable. The coloring agents include any of pigments, dyes, etc. The coloring agent may be used either alone or in combination of two or more types. Further, the dyes can be used in any form of acid dyes, reactive dyes, direct dyes, disperse dyes, cationic dyes, etc. Further, the form of the pigments is not especially limited, and it can be appropriately selected from the known pigments and used.

When dyes are used as the coloring agents, the films 40 for the backside of a semiconductor (consequently a dicing-Tape Integrated Film 1 for Backside of Semiconductor) having uniform or almost uniform coloring concentration can be easily manufactured because the dyes disperse uniformly or almost uniformly due to dissolution in the films 40 for the backside of a semiconductor. Because of that, when the dyes are used as the coloring agents, the coloring concentration of the film for the backside of a semiconductor in the dicing tape-integrated film for the backside of a semiconductor can be made uniform or almost uniform, and the marking property and the appearance can be improved.

The black color material is not especially limited, and can be appropriately selected from inorganic black pigments and black dyes, for example. The black color material may be a color material mixture in which a cyan color material (blue-green color material), a magenta color material (red-purple color material), and a yellow color material are mixed together. The black color materials can be used alone or two types or more can be used together. The black color materials can be used also with other color materials other than black.

Specific examples of the black color materials include carbon black such as furnace black, channel black, acetylene black, thermal black, and lamp black, graphite (black lead), copper oxide, manganese dioxide, azo pigments such as azomethine azo black, aniline black, perylene black, titanium black, cyanine black, activated carbon, ferrite such as nonmagnetic ferrite and magnetic ferrite, magnetite, chromium oxide, iron oxide, molybdenum disulfide, chromium complex, complex oxide black, and anthraquinone organic black.

In the present invention, black dyes such as C. I. solvent black 3, 7, 22, 27, 29, 34, 43, and 70, C. I. direct black 17, 19, 22, 32, 38, 51, and 71, C. I. acid black 1, 2, 24, 26, 31, 48, 52, 107, 109, 110, 119, and 154, and C. I. disperse black 1, 3, 10, and 24; and black pigments such as C. I. pigment black 1 and 7 can be used as the black color material.

Examples of the black materials in market include a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", and a trade name "Oil Black 5905" manufactured by Orient Chemical Industries Co., Ltd.

Examples of color materials other than the black color materials include a cyan color material, a magenta color material, and a yellow color material. Examples of the cyan color material include cyan dyes such as C. I. solvent blue 25, 36, 60, 70, 93, and 95; and C. I. acid blue 6 and 45; and cyan pigments such as C. I. pigment blue 1, 2, 3, 15, 15:1, 15:2, 15:3, 15:4, 15:5, 15:6, 16, 17, 17:1, 18, 22, 25, 56, 60, 63, 65, and 66; C. I. vat blue 4 and 60; and C. I. pigment green 7.

Examples of the magenta color material include magenta dyes such as C. I. solvent red 1, 3, 8, 23, 24, 25, 27, 30, 49, 52, 58, 63, 81, 82, 83, 84, 100, 109, 111, 121, and 122; C. I. disperse red 9; C. I. solvent violet 8, 13, 14, 21, and 27; C. I. disperse violet 1; C. I. basic red 1, 2, 9, 12, 13, 14, 15, 17, 18, 22, 23, 24, 27, 29, 32, 34, 35, 36, 37, 38, 39, and 40; and C. I. basic violet 1, 3, 7, 10, 14, 15, 21, 25, 26, 27, and 28.

Examples of the magenta color material include magenta pigments such as C. I. pigment red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, and 245; C. I. pigment violet 3, 9, 19, 23, 31, 32, 33, 36, 38, 43, and 50; and C. I. vat red 1, 2, 10, 13, 15, 23, 29, and 35.

Examples of the yellow color material include yellow dyes such as C. I. solvent yellow 19, 44, 77, 79, 81, 82, 93, 98, 103, 104, 112, and 162; and yellow pigments such as C. I. pigment orange 31 and 43, C. I. pigment yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, and 195, and C. I. vat yellow 1, 3, and 20.

Various color materials such as cyan color materials, magenta color materials, and yellow color materials can be used alone or two types or more can be used together. When two types or more of various color materials such as cyan color materials, magenta color materials, and yellow color materials are used, the mixing ratio or the compounding ratio of these color materials is not especially limited, and can be appropriately selected according to the types of each color material and the intended color.

The solubility of the coloring agent to toluene at 23° C. is preferably 2 g/100 ml or less. The solubility is preferably 1 g/100 ml or less, and more preferably 0.5 g/100 ml or less. When the coloring agent having relatively high polarity in which its solubility to toluene at 23° C. is 2 g/100 ml or less is contained in the film 40 for the backside of a semiconductor having high polarity, the coloring agent can be retained in the film 40 for the backside of a semiconductor, and the transfer of the coloring agent onto the pressure-sensitive layer 22 can be suppressed.

Examples of the coloring material in market having the solubility to toluene at 23° C. of 2 g/100 ml or less include a trade name "SOM-L-0543" manufactured by Orient Chemical Industries Co., Ltd., a trade name "ORIPACS B-1" manufactured by Orient Chemical Industries Co., Ltd., and a trade name "SDO-7" manufactured by Arimoto Chemical Co., Ltd.

Among the coloring agents described above, a coloring agent having an anthraquinone skeleton is preferable. In general, a molecules having a plurality of benzene rings have low solubility to a solvent due to overlapping of the molecules. Because the anthraquinone skeleton has a structure in which cyclohexane is sandwiched by two benzene rings, the solvent appropriately goes between the molecules compared to pigments such as phthalocyanine. As a result, the solubility to a solvent can be maintained. On the other hand, because the solubility to toluene is low, the transfer of the coloring agent onto the pressure-sensitive adhesive layer can be suppressed. That is, the coloring agent having an anthraquinone skeleton has an excellent balance of the solubility to a solvent and the suppression of transfer of the coloring agent onto the pressure-sensitive adhesive layer.

Other additives can be appropriately compounded in the film 40 for the backside of a semiconductor as necessary. Examples of the other additives include a filler, a flame retardant, a silane coupling agent, an ion trapping agent, an extender, an anti-aging agent, an antioxidant, and a surfactant.

The filler may be any of an inorganic filler and an organic filler. However, an inorganic filler is preferable. By adding a filler such as an inorganic filler, electric conductivity can be given to the film 40 for the backside of a semiconductor, heat conductivity can be improved, and the elastic modulus can be adjusted. The film 40 for the backside of a semiconductor may be electrically conductive or non-conductive. Examples of the inorganic filler include ceramics such as silica, clay, gypsum, calcium carbonate, barium sulfate, alumina oxide, beryllium oxide, silicon carbide, and silicon nitride, metals such as aluminum, copper, silver, gold, nickel, chromium, lead, tin, zinc, palladium, and solder, alloys, and various inorganic powders consisting of carbon. The fillers may be used alone or two types or more can be used together. Among these, silica, especially molten silica is preferable. The average particle size of the inorganic filler is preferably in a range of 0.1 to 80 μm. The average particle size of the inorganic filler can be measured with a laser diffraction type particle size distribution device, for example.

The compounding amount of the filler (especially, the inorganic filler) is preferably 80 parts by weight or less (0 to 80 parts by weight), and especially preferably 0 to 70 parts by weight to 100 parts by weight of the organic resin component.

Examples of the flame retardant include antimony trioxide, antimony pentoxide, and a brominated epoxy resin.

These can be used alone or two types or more can be used together. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These compounds can be used alone or two types or more can be used together. Examples of the ion trap agent include hydrotalcites and bismuth hydroxide. These can be used alone or two types or more can be used together.

The film 40 for the backside of a semiconductor can be formed by a common method of preparing a resin composition by mixing a thermosetting resin such as an epoxy resin, a thermoplastic resin such as an acrylic resin as necessary, and a solvent and other additives as necessary and forming the resin composition into a film-like layer.

When the film 40 for the backside of a semiconductor is formed of a resin composition containing a thermosetting resin such as an epoxy resin, the thermosetting resin in the film 40 for the backside of a semiconductor is uncured or is partially cured at the stage before application to a semiconductor wafer. In this case, the thermosetting resin in the film 40 for the backside of a semiconductor is completely cured or almost completely cured after application to a semiconductor wafer (normally when curing a sealing material in a flip-chip bonding step).

Even if the film 40 for the backside of a semiconductor contains the thermosetting resin, since the thermosetting resin is uncured or is partially cured, the gel fraction of the film 40 for the backside of a semiconductor is not especially limited. The gel fraction can be appropriately selected from a range of 50% by weight or less (0 to 50% by weight), preferably 30% by weight or less (0 to 30% by weight), and especially preferably 10% by weight or less (0 to 10% by weight). The gel fraction of the film for the backside of a semiconductor can be measured by the following method.

<Method of Measuring Gel Fraction>

About 0.1 g of a sample (sample weight) is precisely weighed from the film for the backside of a semiconductor, the sample is wrapped with a mesh sheet, and then the sample is immersed in about 50 ml of toluene at room temperature for a week. After that, the portion insoluble in the solvent (content of the mesh sheet) is taken out of toluene and dried at 130° C. for about 2 hours, and after drying, the portion insoluble in the solvent is weighed (weight after immersion and drying), and the gel fraction (% by weight) is calculated from the following formula (a).

Gel fraction (% by weight)=[(Weight after immersion and drying)/(Sample weight)]×100     (a)

The gel fraction of the film for the backside of a semiconductor can be controlled by the type and the content of the resin component, the type and the content of the crosslinking agent, the heating temperature, the heating time, and the like.

When the film for the backside of a semiconductor in the present invention is a film that is formed with a resin composition containing a thermosetting resin such as an epoxy resin, adhesion to a semiconductor wafer can be exhibited effectively.

The tensile storage modulus at 23° C. of the uncured film 40 for the backside of a semiconductor is preferably 1 GPa or more (1 to 50 GPa, for example), more preferably 2 GPa or more, and especially preferably 3 GPa or more. When the tensile storage modulus is 1 GPa or more, adhesion of the film for the backside of a semiconductor to a support can be effectively suppressed or prevented when a semiconductor chip is peeled from the pressure-sensitive adhesive layer 22 of a dicing tape together with the film 40 for the backside of a semiconductor and the film 40 for the backside of a semiconductor mounted on the support are transported. Examples of the support include a top tape and a bottom tape of a carrier tape.

The tensile storage modulus (23° C.) in the uncured portion of the film for the backside of a semiconductor can be controlled by the type and the content of the resin component (a thermoplastic resin and a thermosetting resin), the type and the content of the filler such as a silica filler, and the like.

When the film 40 for the backside of a semiconductor is a laminated film in which a plurality of layers are laminated (when the film for the backside of a semiconductor has a form of laminated layers), an example of the form of laminated layers includes a form of laminated layers consisting of a wafer adhesion layer (a layer containing no coloring agent) and a laser marking layer (a layer containing no coloring agent). Other layers such as an intermediate layer, a light beam shielding layer, a reinforcing layer, a coloring agent layer, a base layer, an electromagnetic wave shielding layer, a heat conducting layer, and a pressure-sensitive adhesive layer may be provided between the wafer adhesion layer and the laser marking layer. The wafer adhesion layer is a layer having excellent adhesion (tackiness) to a wafer and contacting with the backside of the wafer. The laser marking layer is a layer having an excellent laser marking property and is used to perform laser marking on the backside of a semiconductor chip.

The uncured films 40 for the backside of a semiconductor was produced without laminating the films on the dicing tape 2, and the tensile storage modulus was measured using a dynamic viscoelasticity measurement apparatus (Solid Analyzer RS A2) manufactured by Rheometric Scientific FE, Ltd. in tensile mode, sample width 10 mm, sample length 22.5 mm, sample thickness 0.2 mm, frequency 1 Hz, temperature rise rate 10° C./min, under a nitrogen atmosphere, and at a prescribed temperature (23° C.).

The film 40 for the backside of a semiconductor is preferably protected by a separator (a release liner, not shown in the drawings). The separator has a function of protecting the film for the backside of a semiconductor as a protective material until the film is used. The separator is peeled when pasting the semiconductor wafer onto the film for the backside of a semiconductor. Examples of the separator include polyethylene, polypropylene, aplastic film such as polyethylene terephthalate whose surface is coated with a release agent such as a fluorine release agent or a long chain alkylacrylate release agent, and paper. The separator can be formed by a conventionally known method. The thickness of the separator is also not especially limited.

The light transmittance (visible light transmittance) of visible light (having a wavelength of 400 to 800 nm) in the film 40 for the backside of a semiconductor is not especially limited, and is preferably in a range of 20% or less (0 to 20%), more preferably 10% or less (0 to 10%), and especially preferably 5% or less (0 to 5%). When the visible light transmittance of the film 40 for the backside of a semiconductor is larger than 20%, there is a fear that a bad influence may be given to the semiconductor element when the light beam passes. The visible light transmittance (%) can be controlled by the type and the content of the resin component of the film 40 for the backside of a semiconductor, the type and the content of the coloring agent such as a pigment or a dye, the content of the inorganic filler, and the like.

The visible light transmittance (%) of the film for the backside of a semiconductor can be measured as follows. That is, a film for the backside of a semiconductor having a thickness (average thickness) of 20 µm is produced. The film for the backside of a semiconductor is then irradiated with visible light having a wavelength of 400 to 800 nm (a visible light generator "Absorption Spectro Photometer" manufactured by Shimadzu Corporation) at a prescribed intensity, and the intensity of the transmitted visible light beam is measured. The visible light transmittance can be obtained from a change of the intensity before and after the visible light beam transmits through the film for the backside of a semiconductor. It is also possible to obtain the visible light transmittance (%; wavelength: 400 to 800 nm) of the film for the backside of a semiconductor having a thickness of 20 µm from the visible light transmittance (%; wavelength: 400 to 800 nm) of the film for the backside of a semiconductor whose thickness is not 20 µm. The visible light transmittance (%) of the film for the backside of a semiconductor having a thickness of 20 µm is obtained in the present invention. However, the thickness of the film for the backside of a semiconductor according to the present invention is not limited to 20 µm.

The coefficient of moisture absorption of the film 40 for the backside of a semiconductor is preferably low. Specifically, the coefficient of moisture absorption is preferably 1% by weight or less, and more preferably 0.8% by weight or less. By making the coefficient of moisture absorption 1% by weight or less, the laser marking property can be improved. Further, generation of voids between the film 40 for the backside of a semiconductor and the semiconductor element can be suppressed or prevented in a reflow step, for example. The coefficient of moisture absorption is a value calculated from the weight change before and after the film 40 for the backside of a semiconductor are left under an atmosphere of a temperature of 85° C. and a relative humidity of 85% RH for 168 hours. When the film 40 for the backside of a semiconductor are formed of a resin composition containing a thermosetting resin, the coefficient of moisture absorption is a value obtained the films for the backside of a semiconductor after thermal curing are left under an atmosphere of a temperature of 85° C. and a relative humidity of 85% RH for 168 hours. The coefficient of moisture absorption can be adjusted by changing the added amount of the inorganic filler, for example.

The ratio of the volatile component of the film 40 for the backside of a semiconductor is preferably small. Specifically, the weight decrease rate (ratio of the weight decrease amount) of the film 40 for the backside of a semiconductor after a heat treatment is preferably 1% by weight or less, and more preferably 0.8% by weight or less. The condition of the heating treatment is a heating temperature of 250° C. and a heating time of 1 hour, for example. By making the weight decrease rate 1% by weight or less, the laser marking property can be improved. The generation of cracks in the flip-chip type semiconductor device can be suppressed or prevented in a reflow step, for example. The weight decrease rate can be adjusted by adding an inorganic substance that can decrease the generation of cracks during a lead free solder reflow, for example. When the film 40 for the backside of a semiconductor is formed with a resin composition containing a thermosetting resin, the weight decrease rate means a value obtained when the film for the backside of a semiconductor after thermal curing is heated under conditions of a heating temperature of 250° C. and a heating time of 1 hour.

The thickness of the film 40 for the backside of a semiconductor is not especially limited. However, it can be appropriately selected from a range of about 2 µm to 200 µm. The thickness is preferably about 4 µm to 160 µm, more preferably about 6 µm to 100 µm, and especially preferably about 10 µm to 80 µm.

(Dicing Tape)

The dicing tape 2 has a configuration in which the pressure-sensitive adhesive layer 22 is formed on the base 21. As described above, the dicing tape may have a configuration in which the base 21 and the pressure-sensitive adhesive layer 22 are laminated. The base can be used as a support base body of the pressure-sensitive adhesive layer, and the like. The base 21 preferably has radiation transparency. Examples of the base 21 include appropriate thin materials including paper bases such as paper; fiber bases such as cloth, unwoven cloth, felt, and net; metal bases such as a metal foil and a metal plate; plastic bases such as a plastic film and sheet; rubber bases such as a rubber sheet; foams such as a foamed sheet, and laminated bodies of these (especially laminated bodies of a plastic base and other bases and laminated bodies of plastic films or sheets). In the present invention, a plastic base such as a plastic film or sheet can be preferably used as the base. Examples of the material of such a plastic base include olefin resins such as polyethylene (PE), polypropylene (PP), and an ethylene-propylene copolymer; copolymers having ethylene as a monomer component such as a ethylene vinyl acetate copolymer (EVA), an ionomer resin, a ethylene-(meth)acrylate copolymer, and an ethylene-(meth)acrylate (random, alternating) copolymer; polyesters such as polyethylene terephthalate (PET), polyethylene naphthalate (PEN), and polybutylene terephthalate (PBT); an acrylic resin; polyvinyl chloride (PVC); polyurethane; polycarbonate; polyphenylene sulfide (PPS); amide resins such as polyamide (nylon) and fully aromatic polyamide (aramid); polyether ether ketone (PEEK); polyimide; polyetherimide; polyvinylidene chloride; ABS (acrylonitrile-butadiene-styrene copolymer); a cellulose resin; a silicone resin; and a fluororesin.

Further, the material of the base 21 includes a polymer such as a cross-linked body of the above resins. The above plastic film may be also used unstreched, or may be also used on which a monoaxial or a biaxial stretching treatment is performed depending on necessity. According to resin sheets in which heat shrinkable properties are given by the stretching treatment, etc., the adhesive area of the pressure-sensitive adhesive layer 22 and the film 40 for the backside of a semiconductor are reduced by thermally shrinking the base 21 after dicing, and the recovery of the semiconductor chips (a semiconductor element) can be facilitated.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the base 21 in order to improve adhesiveness, holding properties, etc. with the adjacent layer.

The same type or different types can be appropriately selected and used as the base 21, and several types can be blended and used as necessary. A vapor deposited layer of a conductive substance having a thickness of about 30 to 500 Å consisting of metals, alloys, and oxides of these can be provided on the base 21 to give an antistatic function to the base 21. The base 21 may be a single layer or a multilayer consisting of two types or more layers.

The thickness of the base 21 (total thickness in the case of a laminated body) is not especially limited, and can be appropriately selected according to the strength, flexibility, purpose of use, and the like. For example, the thickness is generally 1000 µm or less (1 to 1000 µm, for example), preferably 10 to 500 µm, more preferably 20 to 300 µm, and especially preferably about 30 to 200 µm. However, the thickness is not limited to these ranges.

The base 21 may contain various additives such as a coloring agent, a filler, a plasticizer, an anti-aging agent, an antioxidant, a surfactant, and a flame retardant as long as the effects of the present invention are not deteriorated.

The pressure-sensitive adhesive layer 22 is formed with a pressure-sensitive adhesive, and has adherability. The pressure-sensitive adhesive is not especially limited, and can be appropriately selected among known pressure-sensitive adhesives. Specifically, known pressure-sensitive adhesives (refer to Japanese Patent Application Laid-Open Nos. 56-61468, 61-174857, 63-17981, and 56-13040, for example) such as a pressure-sensitive adhesive having the above-described characteristics can be appropriately selected from an acrylic pressure-sensitive adhesive, a rubber pressure-sensitive adhesive, a vinylalkylether pressure-sensitive adhesive, a silicone pressure-sensitive adhesive, a polyester pressure-sensitive adhesive, a polyamide pressure-sensitive adhesive, a urethane pressure-sensitive adhesive, a fluorine pressure-sensitive adhesive, a styrene-diene block copolymer pressure-sensitive adhesive, and a creep property improved pressure-sensitive adhesive in which a hot-melt resin having a melting point of about 200° C. or less is compounded in these pressure-sensitive adhesives. A radiation curing type pressure-sensitive adhesive (or an energy ray curing type pressure-sensitive adhesive) and a thermally expandable pressure-sensitive adhesive can also be used as the pressure-sensitive adhesive. The pressure-sensitive adhesives can be used alone or two types or more can be used together.

However, when the pressure-sensitive adhesive layer 22 consists of a plurality of layers, it is preferable to have a silicone pressure-sensitive adhesive layer containing a silicone based pressure-sensitive adhesive at the interface with the film 44 for the backside of a semiconductor. With this configuration, the difference (γ2−γ1) of the surface free energy can be easily made large. A pressure-sensitive adhesive other than the silicone based pressure-sensitive adhesive may be used as other layers that do not become the interface with the film 44 for the backside of a semiconductor.

When the pressure-sensitive adhesive layer 22 consist of a single layer, it is preferable to have a silicone pressure-sensitive adhesive layer containing a silicone based pressure-sensitive adhesive as the pressure-sensitive adhesive layer 22. With this configuration, the difference (γ2−γ1) of the surface free energy can be easily made large.

An example of the acrylic pressure-sensitive adhesive is an acrylic pressure-sensitive adhesive having an acrylic polymer, in which one type or two types or more of alkyl (meth)acrylates are used as a monomer component, as a base polymer.

Examples of alkyl (meth)acrylates in the acrylic pressure-sensitive adhesive include methyl (meth)acrylate, ethyl (meth)acrylate, propyl (meth)acrylate, isopropyl (meth) acrylate, butyl(meth)acrylate, isobutyl(meth)acrylate, s-butyl (meth)acrylate, t-butyl (meth)acrylate, pentyl (meth) acrylate, hexyl (meth)acrylate, heptyl (meth)acrylate, octyl (meth)acrylate, 2-ethylhexyl (meth)acrylate, isooctyl (meth) acrylate, nonyl(meth)acrylate, isononyl(meth)acrylate, decyl (meth)acrylate, isodecyl (meth)acrylate, undecyl (met) acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, and eicosyl (meth)acrylate. Alkyl (meth)acrylates having an alkyl group of 4 to 18 carbon atoms is suitable. The alkyl group of alkyl (meth)acrylates may be any of linear or branched chain.

The acrylic polymer may contain units that correspond to other monomer components that is copolymerizable with alkyl (meth)acrylates described above (copolymerizable monomer component) for reforming cohesive strength, heat resistance, and crosslinking property, as necessary. Examples of such copolymerizable monomer components include carboxyl group-containing monomers such as (meth)acrylic acid (acrylic acid, methacrylic acid), carboxyethyl acrylate, carboxypentyl acrylate, itaconic acid, maleic acid, fumaric acid, and crotonic acid; acid anhydride group-containing monomers such as maleic anhydride and itaconic anhydride; hydroxyl group-containing monomers such as hydroxyethyl (meth)acrylate, hydroxypropyl (meth)acrylate, hydroxybutyl (meth)acrylate, hydroxyhexyl (meth)acrylate, hydroxyoctyl (meth)acrylate, hydroxydecyl (meth)acrylate, hydroxylauryl (meth)acrylate, and (4-hydroxymethylcyclohexyl)methyl methacrylate; sulfonate group-containing monomers such as styrenesulfonic acid, allylsulfonic acid, 2-(meth)acrylamide-2-methylpropanesulfonic acid, (meth)acrylamidepropanesulfonic acid, sulfopropyl(meth)acrylate, and (meth)acryloyloxynaphthalenesulfonic acid; phosphate group-containing monomers such as 2-hydroxyethylacryloylphosphate; (N-substituted) amide monomers such as (meth)acrylamide, N,N-dimethyl (meth)acrylamide, N-butyl(meth)acrylamide, N-methylol (meth)acrylamide, and N-methylolpropane(meth)acrylamide; aminoalkyl (meth)acrylate monomers such as aminoethyl (meth)acrylate, N,N-dimethlaminoethyl (meth) acrylate, and t-butylaminoethyl (meth)acrylate; alkoxyalkyl (meth)acrylate monomers such as methoxyethyl (meth)acrylate and ethoxyethyl (meth)acrylate; cyanoacrylate monomers such as acrylonitrile and methacrylonitrile; epoxy group-containing acrylic monomers such as glycidyl(meth) acrylate; styrene monomers such as styrene and α-methylstyrene; vinylester monomers such as vinyl acetate and vinyl propionate; olefin monomers such as isoprene, butadiene, and isobutylene; vinylether monomers such as vinylether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxylic acid amides, and N-vinylcaprolactam; maleimide monomers such as N-cyclohexylmaleimide, N-isopropylmaleimide, N-laurylmaleimide, and N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, and N-laurylitaconimide; succinimide monomers such as N-(meth)acryloyloxymethylene succinimide, N-(meth)acryloyl-6-oxyhexamethylene succinimide, and N-(meth)acryloyl-8-oxyoctamethylene succinimide; glycol acrylester monomers such as polyethylene glycol (meth)acrylate, polypropylene glycol (meth)acrylate, metoxyethylene glycol (meth)acrylate, and metoxypolypropylene glycol (meth)acrylate; acrylate monomers having a heterocyclic ring, a halogen atom, a silicon atom, and the like such as tetrahydrofurfuryl (meth)acrylate, fluorine (meth)acrylate, and silicone (meth)acrylate; and polyfunctional monomers such as hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri (meth)acrylate, pentaerythritol tri(meth)acrylate, dipentaerythritol hexa(meth)acrylate, epoxyacrylate, polyesteracrylate, urethaneacrylate, divinylbenzene, butyl di(meth)acrylate, and hexyl di(meth)acrylate. One type or two types or more of these copolymerizable monomer components can be used.

When a radiation curing type pressure-sensitive adhesive (or an energy ray curing type pressure-sensitive adhesive) is used as the pressure-sensitive adhesive, examples of the radiation curing type pressure-sensitive adhesive (composition) include an internal radiation curing type pressure-sensitive adhesive having a polymer with a radical reactive carbon-carbon double bond in the polymer side chain, the main chain, or the ends of the main chain as a base polymer and a radiation curing type pressure-sensitive adhesive in which ultraviolet-ray curing-type monomer component and oligomer component are compounded in the pressure-sensitive adhesive. When a thermally expandable pressure-sensitive adhesive is used as the pressure-sensitive adhesive, examples thereof include a thermally expandable pressure-sensitive adhesive containing a pressure-sensitive adhesive and a foaming agent (especially, a thermally expandable microsphere).

The pressure-sensitive adhesive layer 22 of the present invention may contain various additives such as a tackifier, a coloring agent, a thickener, an extender, a filler, a plasticizer, an anti-aging agent, an antioxidant, a surfactant, and a crosslinking agent as long as the effects of the present invention are not deteriorated.

The crosslinking agent is not especially limited, and known crosslinking agents can be used. Specific examples of the crosslinking agent include an isocyanate crosslinking agent, an epoxy crosslinking agent, a melamine crosslinking agent, a peroxide crosslinking agent, a urea crosslinking agent, a metal alkoxide crosslinking agent, a metal chelate crosslinking agent, a metal salt crosslinking agent, a carbodiimide crosslinking agent, an oxazoline crosslinking agent, an aziridine crosslinking agent, and an amine crosslinking agent, and an isocyanate crosslinking agent and an epoxy crosslinking agent are preferable. The crosslinking agents can be used alone or two types or more can be used together. The used amount of the crosslinking agent is not especially limited.

Examples of the isocyanate crosslinking agent include lower aliphatic polyisocyanates such as 1,2-ethylene diisocyanate, 1,4-butylene diisocyanate, and 1,6-hexamethylene diisocyanate; alicyclicpolyisocyanates such as cyclopentylene diisocyanate, cyclohexylene diisocyanate, isophorone diisocyanate, hydrogenated tolylene diisocyanate, and hydrogenated xylene diisocyanate; and aromatic polyisocyanates such as 2,4-tolylene diisocyanate, 2,6-tolylene diisocyanate, 4,4'-diphenylmethane diisocyanate, and xylylene diisocyanate. A trimethylolpropane/tolylene diisocyanate trimeric adduct (Coronate L manufactured by Nippon Polyurethane Industry Co., Ltd.), and a trimethylolpropane/hexamethylene diisocyanate trimeric adduct (Coronate HL manufactured by Nippon Polyurethane Industry Co., Ltd.) can also be used. Examples of the epoxy crosslinking agent include N,N,N',N'-tetraglycidyl-m-xylenediamine, diglycidylaniline, 1,3-bis(N,N-glycidylaminomethyl)cyclohexane, 1,6-hexanediol diglycidylether, neopentylglycol diglycidylether, ethyleneglycol diglycidylether, propyleneglycol diglycidylether, polyethyleneglycol diglycidylether, polypropyleneglycol diglycidylether, sorbitol polyglycidylether, glycerol polyglycidylether, pentaerithritol polyglycidylether, polyglycerol polyglycidylether, sorbitan polyglycidylether, trimethylolpropane polyglycidylether, diglycidyl adipate, o-diglycidyl phthalate, triglycidyl-tris(2-hydroxyethyl)isocyanurate, resorcin diglycidylether, bisphenol-S-diglycidylether; and an epoxy resin having two or more epoxy groups in a molecule.

In the present invention, a crosslinking treatment can be performed by irradiation with an electron beam, an ultraviolet ray, or the like instead of using the crosslinking agent or in addition to the use of the crosslinking agent.

The pressure-sensitive adhesive layer 22 can be formed by a common method of forming a sheet-like layer by mixing the pressure-sensitive adhesive with a solvent, other additives, and the like as necessary. Specifically, the pressure-sensitive adhesive layer 22 can be produced by a method of applying the pressure-sensitive adhesive or a mixture containing the pressure-sensitive adhesive, a solvent and other additives to the base 21, a method of forming the pressure-sensitive adhesive layer 22 by applying the above-described mixture to an appropriate separator (release paper, for example), and transferring (adhering) the resultant onto the base 21, for example.

The thickness of the pressure-sensitive adhesive layer 22 is not especially limited, and is about 5 to 300 μm (preferably 5 to 200 μm, more preferably 5 to 100 μm, and especially preferably 7 to 50 μm). When the thickness of the pressure-sensitive adhesive layer 22 is in the above-described range, adequate adhesive power can be exhibited. The pressure-sensitive adhesive layer 22 may be a single layer or a plurality of layers.

In the present invention, an antistatic function can be given to the dicing-Tape Integrated Film 1 for Backside of Semiconductor. With this configuration, generation of static electricity on the films during adhesion and peeling and damages of the circuit due to electrification of the semiconductor wafer, and the like can be prevented. The antistatic function can be given by an appropriate method such as a method of adding an antistatic agent or a conductive substance to the base 21, the pressure-sensitive adhesive layer 22, or the film 40 for the backside of a flip-chip type semiconductor and a method of providing a conductive layer made of a charge-transfer complex or a metal film to the base 21. A method of giving the antistatic function is preferable with which impurity ions that can deteriorate the semiconductor wafer are hardly generated. Examples of the conductive substance (conductive filler) that is compounded to give electric conductivity and to improve heat conductivity include spherical, needle-like, and flaky metal powders of silver, aluminum, gold, copper, nickel, and conductive alloys, metal oxides of alumina, amorphous carbon black, and graphite. However, the film 40 for the backside of a flip-chip type semiconductor are preferably electrically non-conductive from the viewpoint of making the films have no electrical leakage.

The dicing-Tape Integrated Film 1 for Backside of Semiconductor may be formed in a form in which the films are wound into a roll or a form in which the films are laminated. When the films have a form in which they are wound into a roll, a dicing tape-integrated film for the backside of a semiconductor having a form in which the films are wound into a roll can be produced by winding a laminated body of the film for the backside of a flip-chip type semiconductor and the dicing tape into a roll while protecting the film or the laminated body with a separator as necessary. The dicing-Tape Integrated Film 1 for Backside of Semiconductor that is wound into a roll may be configured with the base 21, the pressure-sensitive adhesive layer 22 that is formed on one side of the base 21, the film 40 for the backside of a semiconductor that is formed on the pressure-sensitive adhesive layer 22, and a release treatment layer (a back treatment layer) that is formed on the other surface of the base 21.

The thickness of the dicing-Tape Integrated Film 1 for Backside of Semiconductor (total thickness of the film for the backside of a semiconductor and the dicing tape consisting of the base 21 and the pressure-sensitive adhesive layer 22) can be selected from a range of 7 to 11300 μm, and is preferably 17 to 1600 μm, and more preferably 28 to 1200 μm.

By controlling the ratio between the thickness of the film for the backside of a flip-chip type semiconductor and the thickness of the pressure-sensitive adhesive layer of the dicing tape and the ratio between the thickness of the film for the backside of a flip-chip type semiconductor and the thickness of the dicing tape (total thickness of the base and the pressure-sensitive adhesive layer) in the dicing tape-integrated film for the backside of a semiconductor, the dicing property in a dicing step, the pickup property in a pickup step, and the like can be improved, and the dicing tape-integrated film for the backside of a semiconductor can be effectively used from the dicing step of a semiconductor wafer to the flip-chip bonding step of a semiconductor chip.

(Method of Manufacturing Dicing Tape-Integrated Film for the Backside of Semiconductor)

A method of manufacturing the dicing tape-integrated film for the backside of a semiconductor according to this embodiment is explained using the dicing-Tape Integrated Film 1 for Backside of Semiconductor shown in FIG. 1 as an example. First, the base 21 can be formed by a conventionally known film forming method. Examples of the film forming method include a calender film forming method, a casting method in an organic solvent, an inflation extrusion method in a closed system, a T die extrusion method, a co-extrusion method, and a dry laminating method.

The pressure-sensitive adhesive layer 22 is formed by applying a pressure-sensitive adhesive composition to the base 21 and drying the composition (by crosslinking by heat as necessary). Examples of the application method include roll coating, screen coating, and gravure coating. The pressure-sensitive adhesive layer 22 may be formed on the base 21 by applying the pressure-sensitive adhesive composition directly to the base 21, or the pressure-sensitive adhesive layer 22 may be transferred to the base 21 after the pressure-sensitive adhesive layer 22 is formed by applying the pressure-sensitive adhesive composition to a release paper whose surface has been subjected to a release treatment. With this configuration, the dicing tape 2 is produced in which the pressure-sensitive adhesive layer 22 is formed on the base 21.

On the other hand, a formation material for forming the film 40 for the backside of a semiconductor is applied onto release paper so that the thickness after drying becomes prescribed thickness, and then, it is dried under a prescribed condition (drying by carrying out a heating treatment when thermal curing is necessary, etc.) to form a coating layer. This coating layer is transferred onto the pressure-sensitive adhesive layer 22 to form the film 40 for the backside of a semiconductor on the pressure-sensitive adhesive layer 22. Further, a formation material for forming the film 40 for the backside of a semiconductor is applied directly onto the pressure-sensitive adhesive layer 22, and it is dried under a prescribed condition (drying by carrying out a heating treatment when thermal curing is necessary, etc.) also to form the film 40 for the backside of a semiconductor on the pressure-sensitive adhesive layer 22. With this, the dicing-tape integrated film 1 for the backside of a semiconductor according to the present invention can be obtained. When thermal curing is performed to form the film 40 for the backside of a semiconductor, it is important to perform thermal curing up to a level at which the film is partially cured. However, it is preferable not to perform thermal curing.

The dicing-Tape Integrated Film 1 for Backside of Semiconductor can be used suitably in the manufacture of a semiconductor device having a flip-chip connecting step. The dicing-Tape Integrated Film 1 for Backside of Semiconductor of the present invention is used to manufacture a flip-chip mounted semiconductor device, and the flip-chip mounted semiconductor device is manufactured in a form in which the film 40 for the backside of a semiconductor of the dicing-Tape Integrated Film 1 for Backside of Semiconductor is pasted to the backside of the semiconductor chip. Therefore, the dicing-Tape Integrated Film 1 for Backside of Semiconductor of the present invention can be used for a flip-chip mounted semiconductor device (a semiconductor device in a form in which the semiconductor chip is fixed to an adherend such as a substrate by a flip-chip bonding method).

(Semiconductor Wafer)

The semiconductor wafer is not especially limited as long as it is a known or common semiconductor wafer, and semiconductor wafers made of various materials can be appropriately selected and used. In the present invention, a silicon wafer can be suitably used as the semiconductor wafer.

(Method of Manufacturing Semiconductor Device)

In the following, the method of manufacturing a semiconductor device according to this embodiment is explained by referring to FIG. 2. FIG. 2 is a sectional schematic drawing showing a method of manufacturing a semiconductor device using the dicing-Tape Integrated Film 1 for Backside of Semiconductor.

The method of manufacturing a semiconductor device according to the present embodiment at least has a step A of pasting a semiconductor wafer on the film 40 for the backside of a semiconductor in the dicing-tape integrated film 1 for the backside of a semiconductor, a step B of performing laser marking to the film 40 for the backside of a semiconductor from the dicing tape 2 side after the step A, a step C of dicing the semiconductor wafer to form a semiconductor element, a step D of peeling the semiconductor element from the pressure-sensitive adhesive layer 22 together with the film 40 for the backside of a semiconductor, and a step E of flip-chip bonding the semiconductor element on an adherend.

[Mounting Step]

Figure 2A:
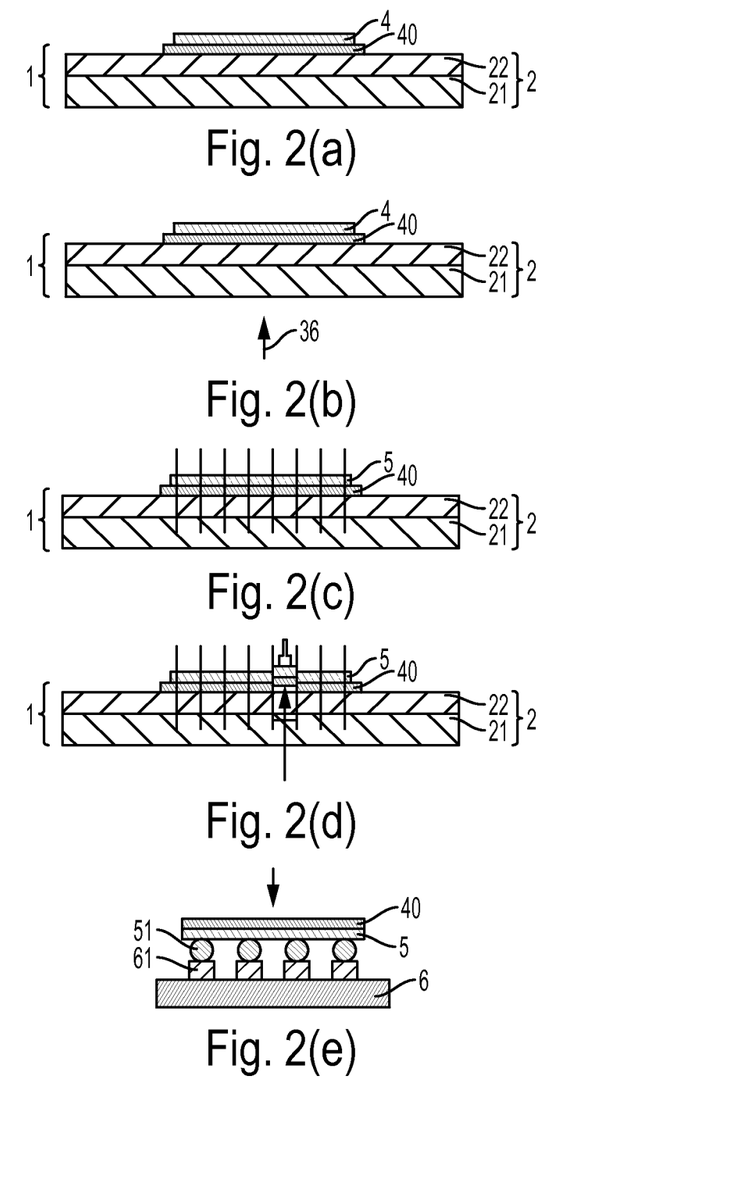
FIG. 2(a) is a view showing mounting step.

As shown in FIG. 2(a), the separator that is appropriately provided on the film 40 for the backside of a semiconductor of the dicing-Tape Integrated Film 1 for Backside of Semiconductor is appropriately peeled off, a semiconductor wafer 4 is pasted to the film 40 for the backside of a semiconductor, and the laminate is fixed by adhering and holding (step A). At this time, the film 40 for the backside of a semiconductor is uncured (including a condition of being partially cured). The dicing-Tape Integrated Film 1 for Backside of Semiconductor is pasted to the backside of the semiconductor wafer 4. The backside of the semiconductor wafer 4 means the surface opposite to the circuit surface (also referred to as a non-circuit surface or a non-electrode forming surface). The pasting method is not especially limited, and a pasting method by pressure-bonding is preferable. The pressure-bonding is performed by pressing by a pressing means such as a press roll.

Next, baking (heating) is performed as necessary in order to firmly fix the film 40 for the backside of a semiconductor to a semiconductor wafer 4. This baking is performed at 80° C. to 150° C. for 0.1 hour to 24 hours for example.

[Laser Marking Step]

Next, as shown in FIG. 2(*b*), laser marking is performed on the film 40 for the backside of a semiconductor using a laser 36 for laser marking from the dicing tape 2 side (step B). The condition of laser marking is not especially limited. However, it is preferable to irradiate the film 40 for the backside of a semiconductor with a laser beam [wavelength: 532 nm] having the intensity of 0.3 W to 2.0 W. Further, it is preferable to irradiate so that the process depth (depth) becomes 2 μm or more. The upper limit of the process depth is not especially limited. However, it can be selected from a range of 2 μm to 25 μm, it is preferably 3 μm or more (3 μm to 20 μm), and more preferably 5 μm or more (5 μm to 15 μm). The condition of laser marking is set to be within the above-described ranges to exhibit excellent laser marking properties. When the coloring agent having relatively high polarity in which its solubility to toluene at 23° C. is 2 g/100 ml or less is contained to the film 40 for the backside of a semiconductor having high polarity, the transfer of the coloring agent onto the pressure-sensitive adhesive layer 22 by heating such as the baking step is suppressed. As a result, a problem hardly occurs in which the laser beam is blocked by the coloring agent transferred to the dicing tape 2, the laser beam does not reach to the film 40 for the backside of a semiconductor, and laser marking cannot be performed well, even when the laser beam was irradiated from the dicing tape 2 side.

Further, the laser processing properties of the film 40 for the backside of a semiconductor can be controlled by the types and the content of the constituting resin components, the type and the content of the coloring agent, the type and the content of the crosslinking agent, the type and the content of the filler, etc.

[Dicing Step]

As shown in FIG. 2 (*c*), dicing of the semiconductor wafer 4 is performed. With this operation, the semiconductor wafer 4 is cut into individual pieces (cut into small pieces) having a prescribed size, and a semiconductor chip 5 is manufactured (step C). The dicing is performed from the circuit surface side of the semiconductor wafer 4 by a normal method, for example. For example, a cutting method called full cut in which cutting is performed up to the dicing-Tape Integrated Film 1 for Backside of Semiconductor can be adopted in this step. The dicing apparatus used in this step is not especially limited, and a conventionally known apparatus can be used. Because the semiconductor wafer 4 is adhered and fixed with excellent adhesion by the dicing-Tape Integrated Film 1 for Backside of Semiconductor having the film for the backside of a semiconductor, chip cracks and chip fly can be suppressed and damages to the semiconductor wafer 4 can also be suppressed.

When expanding the dicing-Tape Integrated Film 1 for Backside of Semiconductor, a conventionally known expanding apparatus can be used. The expanding apparatus has a donut-shaped outer ring that can push down the dicing-Tape Integrated Film 1 for Backside of Semiconductor through a dicing ring and an inner ring that has a smaller diameter than the outer ring and that supports the dicing tape-integrated film for the backside of a semiconductor. With this expanding step, generation of damages caused by the contact between adjacent semiconductor chips can be prevented in the pickup step described later.

[Pickup Step]

The semiconductor chip 5 is peeled from the dicing tape 2 together with the film 40 for the backside of a semiconductor by performing pickup of the semiconductor chip 5 as shown in FIG. 2(*d*) to collect the semiconductor chip 5 that is adhered and fixed to the dicing-Tape Integrated Film 1 for Backside of Semiconductor (step D). The pickup method is not especially limited, and various conventionally known methods can be adopted. An example of the method is a method of pushing up an individual semiconductor chip 5 from the side of the base 21 of the dicing-Tape Integrated Film 1 for Backside of Semiconductor with a needle and picking up the pushed semiconductor chip 5 with a pickup apparatus.

In the present embodiment, because the difference (γ2−γ1) of the surface free energy γ1 and the surface free energy γ2 is 10 mJ/m$^2$ or more, the increase of the peel strength between the dicing tape and the film for the backside of a flip-chip semiconductor is suppressed even when the dicing-tape integrated film for the backside of a semiconductor is heated in the step A, etc. for example. Therefore, occurrence of poor peeling in the step D is suppressed.

When a radiation curing type pressure-sensitive adhesive (or an energy beam curing type pressure-sensitive adhesive) is used as the pressure-sensitive adhesive constituting the pressure-sensitive adhesive layer 22, it is preferably to irradiate the layer with an ultraviolet ray to perform pickup. With this, pickup can be performed easily. Especially, in the laser marking step, air bubbles may be generated at the interface between the film 40 for the backside of a semiconductor and the pressure-sensitive adhesive layer 22. Because of that, a radiation curing type pressure-sensitive adhesive (or an energy beam curing type pressure-sensitive adhesive) is used as the pressure-sensitive adhesive constituting the pressure-sensitive adhesive layer 22, the pressure-sensitive adhesive layer 22 and the film 40 for the backside of a semiconductor are firmly pasted together in the laser marking step to suppress the generation of air bubbles. Then, it is preferable to irradiate the layer with radiation (or an energy beam) to lower the adhesive power and to perform pickup easily during pickup.

The backside of the semiconductor chip 5 that is picked up is protected by the film 40 for the backside of a semiconductor.

[Flip-Chip Connecting Step]

As shown in FIG. 2(*e*), the semiconductor chip 5 that is picked up is fixed to an adherend such as a substrate by a flip-chip bonding method (flip-chip mounting method) (step E). Specifically, the semiconductor chip 5 is fixed to an adherend 6 by a normal method in a form that the circuit surface (also referred to as the surface, a circuit pattern forming surface, or an electrode forming surface) of the semiconductor chip 5 faces the adherend 6. The semiconductor chip 5 can be fixed to the adherend 6 while securing electrical conduction of the semiconductor chip 5 with the adherend 6 by contacting and pressing a bump 51 formed on the circuit surface side of the semiconductor chip 5 to a conductive material 61 such as solder for bonding that is adhered to a connection pad of the adherend 6 and melting the conductive material (a flip-chip bonding step). At this time, a space is formed between the semiconductor chip 5 and the adherend 6, and the distance of the space is generally about 30 to 300 μm. After flip-chip bonding (flip-chip connection) of the semiconductor chip 5 onto the adherend 6, it is important to wash the facing surface and the space between the semiconductor chip 5 to the adherend 6 and to seal the space by filling the space with a sealing material such as a sealing resin.

Various substrates such as a lead frame and a circuit board (a wiring circuit board, for example) can be used as the adherend 6. The material of the substrate is not especially limited, and examples thereof include a ceramic substrate and a plastic substrate. Examples of the plastic substrate include an epoxy substrate, a bismaleimide triazine substrate, and a polyimide substrate.

The material of the bump and the conductive material in the flip-chip bonding step are not especially limited, and examples thereof include solders (alloys) of a tin-lead metal material, a tin-silver metal material, a tin-silver-copper metal material, a tin-zinc metal material, and a tin-zinc-bismuth metal material, a gold metal material, and a copper metal material.

In the flip-chip bonding step, the bump of the circuit surface side of the semiconductor chip 5 and the conductive material on the surface of the adherend 6 are connected by melting the conductive material. The temperature when the conductive material is molten is normally about 260° C. (250 to 300° C., for example). The dicing tape-integrated film for the backside of a semiconductor of the present invention can have heat resistance so that it can resist a high temperature in the flip-chip bonding step by forming the film for the backside of a semiconductor with an epoxy resin, or the like.

In this step, the facing surface (an electrode forming surface) and the space between the semiconductor chip 5 and the adherend 6 are preferably washed. The washing liquid that is used in washing is not especially limited, and examples thereof include an organic washing liquid and a water washing liquid. The film for the backside of a semiconductor in the dicing tape-integrated film for the backside of a semiconductor of the present invention has solvent resistance to the washing liquid, and does not substantially have solubility in these washing liquids. Because of that, various washing liquids can be used as the washing liquid, and washing can be performed by a conventional method without requiring a special washing liquid.

Next, a sealing step is performed to seal the space between the flip-chip bonded semiconductor chip 5 and the adherend 6. The sealing step is performed using a sealing resin. The sealing condition is not especially limited. Thermal curing (reflow) of the sealing resin is performed normally by heating the sealing resin at 175° C. for 60 to 90 seconds. However, the present invention is not limited to this, and curing can be performed at 165 to 185° C. for a few minutes, for example. In the heat process of this step, thermal curing of not only the sealing resin but also the film 40 for the backside of a semiconductor may be performed at the same time. In this case, it is not necessary to newly add a step for thermally curing the film 40 for the backside of a semiconductor. However, the present invention is not limited to this example, a step of thermally curing the film 40 for the backside of a semiconductor may be performed separately before the sealing resin is thermally cured.

The sealing resin is not especially limited as long as it is a resin having insulation properties, and can be appropriately selected from sealing materials such as a known sealing resin. However, an insulating resin having elasticity is preferable. Examples of the sealing resin include a resin composition containing an epoxy resin. Examples of the epoxy resin include epoxy resins described above. The sealing resin with a resin composition containing an epoxy resin may contain a thermosetting resin such as a phenol resin other than the epoxy resin, a thermoplastic resin, and the like as a resin component besides the epoxy resin. The phenol resin can also be used as a curing agent for the epoxy resin, and examples of the phenol resin include the above-described phenol resins.

In the above-described embodiment, a case is explained in which the space between a semiconductor chip 5 and an adherend 6 is sealed by filling the space with liquid sealant (a sealing resin, etc.). However, the present invention is not limited to this example, and a sheet resin composition may be used. As the method of sealing the space between the semiconductor chip and the adherend using a sheet rein composition, conventionally known methods described in JP-A-2001-332520, etc. can be adopted. Therefore, the detailed explanation of the method is omitted.

In the above-described embodiment, a case is explained in which the film 40 for the backside of a semiconductor is thermally cured after dicing. However, the present invention is not limited to this example, and the film 40 for the backside of a semiconductor may be thermally cured before the dicing step. In this case, the increase of the peel strength between the dicing tape and the film for the backside of a flip-chip semiconductor is suppressed even when the dicing-tape integrated film for the backside of a semiconductor is heated by the heat in the step of thermally curing. Therefore, occurrence of poor peeling in the pickup step is suppressed.

After the sealing step is performed, a heat treatment (a reflow step) may be performed as necessary. The condition of the heat treatment is not especially limited, and the heat treatment can be performed according to the standards by JEDEC Solid State Technology Association. For example, the heat treatment can be performed at a temperature (upper limit) of 210 to 270° C. and a period of 5 to 50 seconds. With this step, a semiconductor package can be mounted on a substrate such as a mother board.

Because the semiconductor device that is manufactured using the dicing tape-integrated film for the backside of a semiconductor of the present invention is a semiconductor device that is mounted by a flip-chip mounting method, the semiconductor device has a shape thinner and smaller than a semiconductor device that is mounted by a die bonding mounting method. Because of this, the semiconductor device can be suitably used as various electronic apparatuses and electronic parts or materials and members thereof. Specific examples of the electronic apparatus in which the flip-chip mounted semiconductor device of the present invention can be used include a portable phone, PHS, a small computer such as PDA (personal digital assistant), a notebook personal computer, Netbook (trademark), or a wearable computer, a small electronic apparatus in which a portable phone and a computer are integrated, Digital Camera (trademark), a digital video camera, a small television, a small game machine, a small digital audio player, an electronic organizer, an electronic dictionary, an electronic apparatus terminal for an electronic book, and a mobile electronic apparatus (portable electronic apparatus) such as a small digital type clock or watch. Examples of the electronic apparatus also include an electronic apparatus other than a mobile type apparatus (i.e., a stationary apparatus) such as a desktop personal computer, a flat-panel television, an electronic apparatus for recording and playing such as a hard disc recorder or a DVD player, a projector, or a micromachine. Examples of the electronic parts or materials and members of the electronic apparatus and electronic parts include a component of CPU and components of various recording apparatuses such as a memory and a hard disk.

The case in which an electromagnetic wave shielding layer 31 is a single layer was explained in the above-described embodiment. However, the electromagnetic wave shielding layer is not limited to a single layer and it may be two or more layers in the present invention. When the electromagnetic wave shielding layer has two or more layers, the layer configuration is not especially limited. For example, a plurality of electromagnetic wave shielding layers may be laminated without other layers interposed therebetween, or a plurality of electromagnetic wave shielding layers may be laminated with other layers (adhesive layers for example) interposed therebetween. When the electromagnetic wave shielding layer has two or more layers, the electromagnetic wave can be attenuated by one electromagnetic wave shielding layer first and further attenuated by other electromagnetic wave shielding layers.

EXAMPLES

Example 1

<Production of the Film for the Backside of a Semiconductor>

To 100 parts of an acrylic ester based polymer (Paracron W-197CM, manufactured by Negami Chemical Industrial Co., Ltd.) having ethylacrylate as a main component, 113 parts of an epoxy resin (Epicoat 1004, manufactured by Japan Epoxy Resins Co., Ltd.), 121 parts of a phenol resin (MEH-7851H, manufactured by Meiwa Plastic Industries, Ltd.), 246 parts of spherical silica (SO-25R, manufactured by ADMATECHS Co., Ltd.), and 5 parts of dye (OIL BLACK SOM-L-0543, manufactured by Orient Chemical Industries Co., Ltd.) were dissolved in methyethylketone to prepare an adhesive composition solution having a concentration of solid content of 23.6% by weight.

This adhesive composition solution was applied onto a release-treated film consisting of a silicon release-treated polyethyleneterephthalate film having a thickness of 50 μm as a release liner, and dried at 130° C. for 2 minutes to form a film A for the backside of a semiconductor having a thickness of 20 μm.

"OIL BLACK SOM-L-0543" is a dye having an anthraquinone skeleton.

<Dicing Tape>

TRM-6250L manufactured by NITTO DENKO CORPORATION was prepared as a dicing tape A according to Example 1. TRM-6250L has a configuration in which a polyimide base material and a single silicone pressure-sensitive adhesive layer are laminated. TRM-6250L is used to be pasted onto the backside of a lead frame for masking to prevent resin leaking when the lead frame is sealed with a resin, and it is not a tape for dicing as a product.

<Dicing-Tape Integrated Film for the Backside of a Semiconductor>

The film A for the backside of a semiconductor was pasted onto the pressure-sensitive adhesive layer of the dicing tape A using a hand roller to produce the dicing-tape integrated film for the backside of a semiconductor according to Example 1.

Example 2

The dicing-tape integrated film for the backside of a semiconductor according to Example 2 was produced in the same way as Example 1 except that TRM-3650S manufactured by NITTO DENKO CORPORATION was used as a dicing tape. TRM-3650S has a configuration in which a polyimide base material and a single silicone pressure-sensitive adhesive layer are laminated. TRM-3650S is used to be pasted onto the backside of a lead frame for masking to prevent resin leaking when the lead frame is sealed with a resin, and it is not a tape for dicing as a product.

Comparative Example 1

The dicing-tape integrated film for the backside of a semiconductor according to Comparative Example 1 was produced in the same way as Example 1 except that DU-300 manufactured by NITTO DENKO CORPORATION was used as a dicing tape. DU-300 has a configuration in which a polyolefin base material and an ultraviolet ray curing type acrylic pressure-sensitive adhesive layer are laminated.

Comparative Example 2

The dicing-tape integrated film for the backside of a semiconductor according to Comparative Example 2 was produced in the same way as Example 1 except that BT-3100P manufactured by NITTO DENKO CORPORATION was used as a dicing tape. BT-3100P has a configuration in which a polyolefin base material and an acrylic pressure-sensitive adhesive layer (an acrylic pressure-sensitive adhesive layer that is not an ultraviolet ray curing type) are laminated.

(Measurement of the Surface Free Energy)

The produced pressure-sensitive adhesive layer of a dicing-tape integrated film for the backside of a semiconductor and the film for the backside of a semiconductor were peeled at the interface. After that, the surface free energy γ1 of the pressure-sensitive adhesive layer and the surface free energy γ2 of the film for the backside of a semiconductor were calculated. That is, contact angles of water and iodomethane were measured using a contact angle gauge, and each surface free energy value was calculated from the contact angles according to a geometric mean method. The result is shown in Table 1. The difference (γ2−γ1) is also shown in Table 1.

(Measurement of the Peel Strength when the Film for the Backside of a Semiconductor was Peeled from the Pressure-Sensitive Adhesive Layer after Heating at 130° C. For 1 Hour)

The produced dicing-tape integrated film for the backside of a semiconductor was heated at 130° C. for 1 hour. After that, the film for the backside of a semiconductor was peeled from the pressure-sensitive adhesive layer and the peel strength was measured at peeling under a condition of a T-type peeling test of measurement temperature of 23° C. and tensile speed of 300 mm/min using a tensile tester (a trade name "AGS-J" manufactured by Shimadzu Corporation). The case when the peel strength is 0.2 N/mm or less was marked as ○, and the case when it is larger than 0.2 N/mm was marked as X. The result is shown in Table 1.

TABLE 1

|  | Example 1 | Example 2 | Comparative Example 1 | Comparative Example 2 |
| --- | --- | --- | --- | --- |
| Surface Free Energy γ1 (mJ/m²) of Pressure-Sensitive Adhesive Layer | 10.2 | 14.8 | 30.6 | 38.9 |
| Surface Free Energy γ2 (mJ/m²) of Film for Backside | 37.9 | 38.1 | 38.0 | 38.1 |

TABLE 1-continued

|  | Example 1 | Example 2 | Comparative Example 1 | Comparative Example 2 |
|---|---|---|---|---|
| of Semiconductor Difference ($\gamma 2 - \gamma 1$) | 27.7 | 23.3 | 7.4 | −0.8 |
| Peel Strength (N/mm) After Heating at 130° C. for 1 Hour | 0.1 | 0.1 | 10 or more | 0.5 |
| Evaluation of Peel Strength | ○ | ○ | x | x |

(Result)

In the examples in which the difference ($\gamma 2-\gamma 1$) of the surface free energy is 10 mJ/m² or more, good peel strength was exhibited even after heating at 130° C. for 1 hour. On the other hand, in the comparative examples in which the difference ($\gamma 2-\gamma 1$) of the surface free energy is less than 10 mJ/m², the peel strength after heating at 130° C. for 1 hour was larger than that of the examples. In Comparative Example 1, it is considered that deterioration of the ultraviolet ray curing type acrylic pressure-sensitive adhesive layer due to heating resulted in the increase of the peel strength.

EXPLANATION OF REFERENCE NUMERALS

1 Dicing-Tape Integrated Film for Backside of Semiconductor
2 Dicing Tape
21 Substrate
22 Pressure-Sensitive Adhesive Layer
23 Portion Corresponding to Pasting Portion of Semiconductor Wafer
40 Film for Backside of Semiconductor (Film for Backside of Flip-Chip Semiconductor)
4 Semiconductor Wafer
5 Semiconductor Chip
51 Bump Formed on Circuit Surface Side of Semiconductor Chip 5
6 Adherend
61 Conductive Material for Bonding Adhered to Connection Pad of Adherend 6

What is claimed is:

1. A dicing-tape integrated film for a backside of a semiconductor having
a dicing tape having a substrate and pressure-sensitive adhesive layer formed on the substrate and
a film for the backside of a flip-chip semiconductor formed on the pressure-sensitive adhesive layer of the dicing tape, wherein the pressure-sensitive adhesive layer comprises a silicone pressure-sensitive adhesive layer at the interface with the film for the backside of a flip-chip semiconductor, and wherein
the difference ($\gamma 2-\gamma 1$) of the surface free energy $\gamma 2$ and the surface free energy $\gamma 1$ is 10 mJ/m² or more, in which $\gamma_1$ represents the surface free energy that is calculated from contact angles of water and iodomethane measured using a contact angle gauge according to a geometric mean method on the pressure-sensitive adhesive layer, and $\gamma 2$ represents the surface free energy that is calculated from contact angles of water and iodomethane measured using a contact angle gauge according to a geometric mean method on the film for the backside of a flip-chip semiconductor after the pressure-sensitive adhesive layer and the film for the backside of a flip-chip semiconductor are peeled from each other at the interface.

2. The dicing-tape integrated film for the backside of a semiconductor according to claim 1, wherein
the surface free energy $\gamma 1$ is 15 mJ/m² or less.

3. The dicing-tape integrated film for the backside of a semiconductor according to claim 1, wherein
the pressure-sensitive adhesive layer consists of a single layer of the silicone pressure-sensitive adhesive layer containing a silicone pressure-sensitive adhesive.

4. A method of manufacturing a semiconductor device using the dicing-tape integrated film for the backside of a semiconductor according to claim 1 having
a step A of pasting a semiconductor wafer on a film for the backside of a flip-chip semiconductor in the dicing-tape integrated film for the backside of a semiconductor,
a step B of performing laser marking to the film for the backside of a flip-chip semiconductor from the dicing tape side after the step A,
a step C of dicing the semiconductor wafer to form a semiconductor element,
a step D of peeling the semiconductor element from the pressure-sensitive adhesive layer together with the film for the backside of a flip-chip semiconductor, and
a step E of flip-chip bonding the semiconductor element on an adherend.

5. A semiconductor device manufactured using the dicing-tape integrated film for the backside of a semiconductor according to claim 1.

* * * * *